Figure 1:
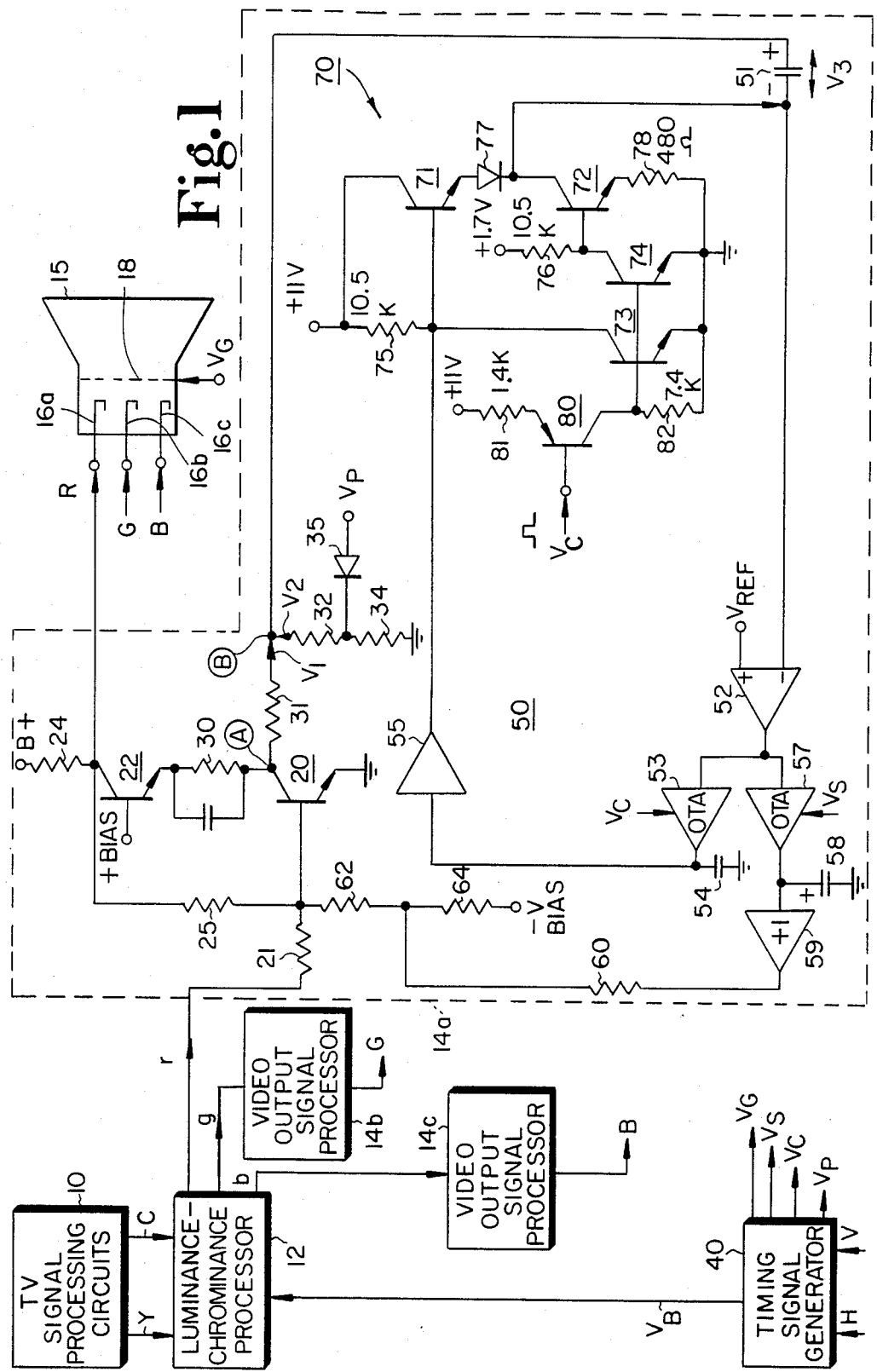

United States Patent [19]

Filliman

[11] Patent Number: 4,513,322

[45] Date of Patent: Apr. 23, 1985

[54] SWITCHING NETWORK WITH SUPPRESSED SWITCHING TRANSIENTS

[75] Inventor: Paul Filliman, Indianapolis, Ind.

[73] Assignee: RCA Corporation, Princeton, N.J.

[21] Appl. No.: 437,828

[22] Filed: Oct. 29, 1982

[51] Int. Cl.³ .............................................. H04N 9/535
[52] U.S. Cl. ..................................... 358/181; 358/27; 358/74; 358/243
[58] Field of Search ............... 358/242, 243, 174, 178, 358/181, 27, 29, 34, 74; 307/246, 240, 248, 573, 350, 351, 352, 353; 328/151, 168, 169, 172, 175

[56] References Cited

U.S. PATENT DOCUMENTS

| | | | |
|---|---|---|---|
| 3,646,362 | 2/1972 | Limberg | 307/238 |
| 4,198,541 | 4/1980 | Fukushima | 179/1 P |
| 4,387,405 | 6/1983 | Hinn | 358/243 |
| 4,414,577 | 11/1983 | Tallant | 358/242 |

Primary Examiner—Tommy P. Chin
Attorney, Agent, or Firm—Eugene M. Whitacre; Paul J. Rasmussen; Ronald H. Kurdyla

[57] ABSTRACT

A switching network for selectively supplying current to a clamping capacitor comprises a pair of output transistors with outputs coupled to the clamp capacitor, a pair of control transistors respectively coupled to the output transistors, and a pair of equal value bias resistors included in output circuits of the control transistors for determining the bias of the output transistors. When the control transistors conduct, the control transistors conduct equal output currents, equal currents flow in the bias resistors, and bias voltages developed across the bias resistors exhibit equal rates of change with a sense for rendering the output transistors non-conductive simultaneously.

19 Claims, 2 Drawing Figures

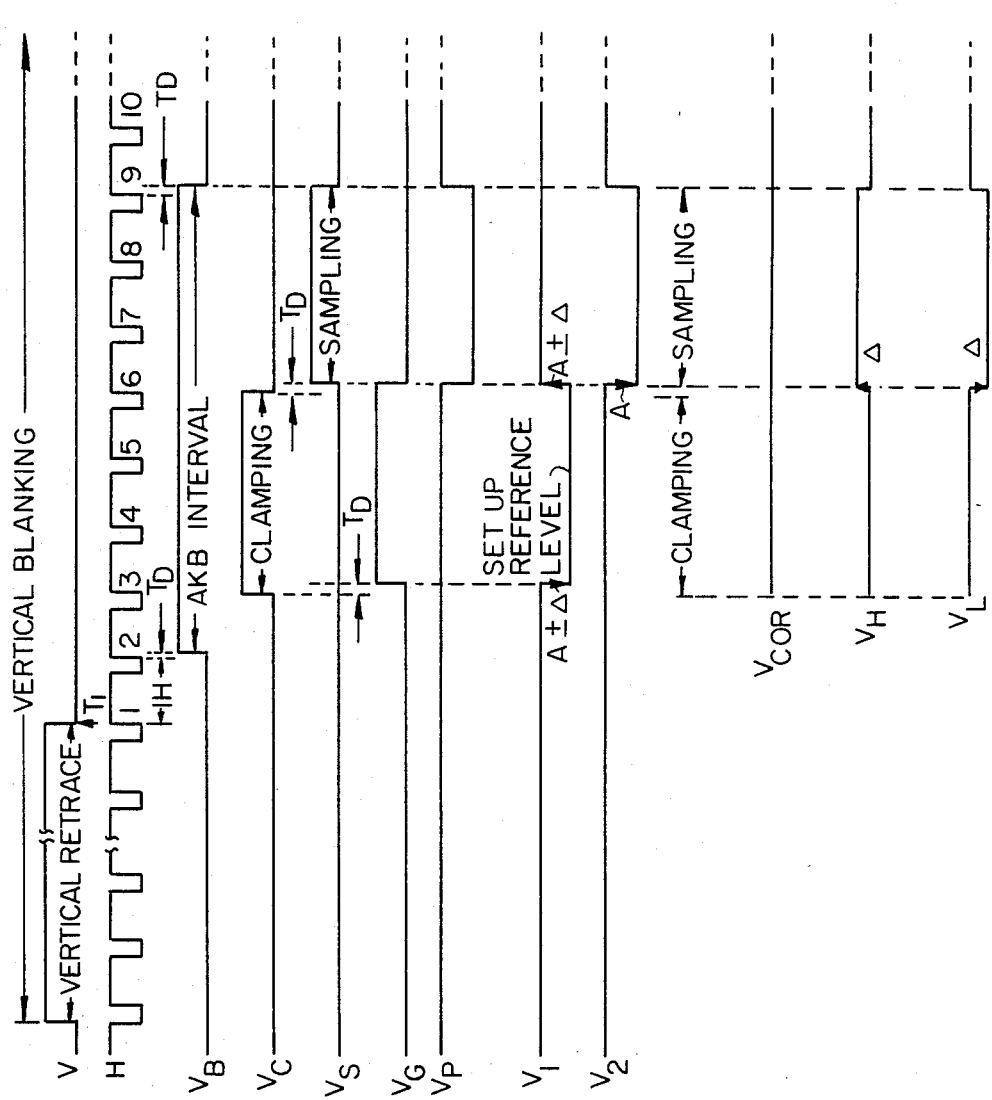

SWITCHING NETWORK WITH SUPPRESSED SWITCHING TRANSIENTS

This invention concerns a switching circuit arranged to suppress transients otherwise likely to be produced during a switching transition from one conductive state to another. In particular, this invention concerns such a switching circuit associated with the clamping reference function in a signal sampling system.

In a signal processing system such as a television receiver, there is a need to periodically sample information (e.g., signal amplitude) contained in signals processed by the system. Before the sampling function is performed, it is often necessary to establish a reference level to which the signal information to be sampled is referenced, in order to assure that an accurate information sample is obtained. The referencing function can be performed by a clamping circuit which operates during clamping intervals preceding the sampling intervals. The clamping circuit is disabled during the sampling interval, e.g., by means of a switching circuit, to prevent interaction with the sampling circuit and the information being processed thereby. In this regard it is desirable to assure that switching transients, such as can be developed at the end of the clamping interval when the clamping circuit is being switchably decoupled, are held to an acceptable minimum. Otherwise, the switching transients can distort the clamping reference level and thereby impair the accuracy of the information sample.

The requirement to suppress such switching transients is particularly evident in a system wherein the magnitude of the transients is signifcant relative to the magnitude of the signal being sampled (e.g., when very small signal amplitude changes are being sampled). This requirement is important, for example, in a system for automatically controlling the bias of a kinescope in a television receiver. In such a system it is often necessary to sample the variable amplitude of a small pulse of a few millivolts peak-to-peak amplitude, for the purpose of developing a control signal capable of automatically controlling kinescope bias to maintain a desired correct bias level.

In accordance with the principles of the present invention there is disclosed herein a switching network with suppressed switching transients. The disclosed circuit is particularly useful in conjunction with a clamping network associated with a small signal sampling system.

The disclosed switching circuit comprises a pair of active current conducting devices with outputs coupled to a capacitance. The switching circuit is arranged such that in the process of being rendered non-conductive, the output devices exhibit mutually equal rates of change of diminishing output currents in response to bias voltages which exhibit mutually equal rates of change with a sense for rendering the output devices non-conductive.

In accordance with a feature of the invention, the switching circuit is included in a signal clamping and sampling system wherein a clamping network establishes a reference level for signals being sampled during a reference interval preceding a sampling interval. The switching circuit couples a reference voltage to the clamping network via a clamping signal path during the reference interval, and decouples the clamping signal path at the end of the clamping interval, at which time switching transients are suppressed to prevent distortion of the reference level established by the clamping network.

In the drawing:

FIG. 1 shows a portion of a color television receiver including an automatic kinescope bias control system with a signal clamping and sampling network and an associated switching network embodying the principles of the present invention; and FIG. 2 illustrates signal waveforms associated with the operation of the system in FIG. 1.

In FIG. 1, television signal processing circuits 10 provide separated luminance (Y) and chrominance (C) components of a composite color television signal to a luminance-chrominance signal processing network 12. Processor 12 includes luminance and chrominance gain control circuits, DC level setting circuits (e.g., comprising keyed black level clamping circuits), color demodulators for developing r-y, g-y and b-y color difference signals, and matrix amplifiers for combining the latter signals with processed luminance signals to provide low level color image representative signals r, g and b. These signals are amplified and otherwise processed by circuits within video output signal processing networks 14a, 14b and 14c, respectively, which supply high level amplified color image signals R, G and B to respective cathode intensity control electrodes 16a, 16b and 16c of a color kinescope 15. Networks 14a, 14b and 14c also perform functions related to the automatic kinescope bias (AKB) control function, as will be discussed. Kinescope 15 is of the self-converging in-line gun type with a commonly energized control grid 18 associated with each of the electron guns comprising cathode electrodes 16a, 16b and 16c.

Since output signal processors 14a, 14b and 14c are similar in this embodiment, the following discussion of the operation of processor 14a also applies to processors 14b and 14c.

Processor 14a includes a kinescope driver stage comprising an input transistor 20 configured as a common emitter amplifier which receives video signal R from processor 12 via an input resistor 21, and an output high voltage transistor 22 configured as a common base amplifier which together with transistor 20 forms a cascode video driver amplifier. High level video signal R, suitable for driving kinescope cathode 16a, is developed across a load resistor 24 in the collector output circuit of transistor 22. Direct current negative feedback for driver 20, 22 is provided by means of a resistor 25.

A sensing resistor 30 DC coupled in series with and between the collector-emitter paths of transistors 20, 22 serves to develop a voltage, at a relatively low voltage sensing node A, representing the level of kinescope cathode black current conducted during kinescope blanking intervals. Resistor 30 functions in conjunction with the AKB system of the receiver, which will now be described.

A timing signal generator 40 containing combinational and sequential logic control circuits as well as level shifting circuits responds to periodic horizontal synchronizing rate signals (H) and to periodic vertical synchronizing rate signals (V), both derived from deflection circuits of the receiver, for generating timing signals $V_B$, $V_S$, $V_C$, $V_P$ and $V_G$ which control the operation of the AKB function during periodic AKB intervals. Each AKB interval begins shortly after the end of the vertical retrace interval within the vertical blanking interval, and encompasses several horizontal line intervals also within the vertical blanking interval and during which video signal image information is absent. These timing signals are illustrated by the waveforms in FIG. 2.

Referring to FIG. 2 for the moment, timing signal $V_B$, used as a video blanking signal, comprises a positive pulse generated soon after the vertical retrace interval ends at time $T_1$, as indicated by reference to signal waveform V. Blanking signal $V_B$ exists for the duration of the AKB interval and is applied to a blanking control input terminal of luminance-chrominance processor 12 for causing the r, g and b outputs of processor 12 to exhibit a black image representative DC reference level corresponding to the absence of video signals. This can be accomplished by reducing the signal gain of processer 12 to substantially zero via the gain control circuits of processor 12 in response to signal $V_B$, and by modifying the DC level of the video signal processing path via the DC level control circuits of processor 12 to produce a black image representative reference level at the signal outputs of processor 12. Timing signal $V_G$, used as a positive grid drive pulse, encompasses three horizontal line intervals within the vertical blanking interval. Timing signal $V_C$ is used to control the operation of a clamping circuit associated with the signal sampling function of the AKB system. Timing signal $V_S$, used as a sampling control signal, occurs after signal $V_C$ and serves to time the operation of a sample and hold circuit which develops a DC bias control signal for controlling the kinescope cathode black current level. Signal $V_S$ encompasses a sampling interval the beginning of which is slightly delayed relative to the end of the clamping interval encompassed by signal $V_C$, and the end of which substantially coincides with the end of the AKB interval. A negative-going auxiliary pulse $V_P$ coincides with the sampling interval. Signal timing delays $T_D$ indicated in FIG. 2 are on the order of 200 nanoseconds.

Referring again to FIG. 1, during the AKB interval positive pulse $V_G$ (e.g., on the order of +10 volts) forward biases grid 18 of the kinescope, thereby causing the electron gun comprising cathode 16a and grid 18 to increase conduction. At times other than the AKB intervals, signal $V_G$ provides the normal, less positive, bias for grid 18. In response to positive grid pulse $V_G$, a similarly phased, positive current pulse appears at cathode 16a during the grid pulse interval. The amplitude of the cathode output current pulse so developed is proportional to the level of cathode black current conduction (typically a few microamperes).

The induced positive cathode output pulse appears at the collector of transistor 22, and is coupled to the base input of transistor 20 via feedback resistor 25, causing the current conduction of transistor 20 to increase proportionally while the cathode pulse is present. The increased current conducted by transistor 20 casuses a voltage to be developed across sensing resistor 30. This voltage is in the form of a negative-going voltage change which appears at sensing node A and which is proportional in magnitude to the magnitude of the black current representative cathode output pulse. The magnitude of the voltage change at node A is determined by the product of the value of resistor 30 times the magnitude of the current flowing through resistor 30. The voltage change at node A is coupled via small resistor 31 to a node B at which a voltage change $V_1$, essentially corresponding to the voltage change at node A, is developed. Node B is coupled to a bias control voltage processing network 50.

Network 50 performs signal clamping and sampling functions. The clamping function is performed during a clamping interval within the AKB interval by means of a feedback clamping network comprising an input AC coupling capacitor 51, an operational amplifier 52 which functions as a voltage amplifier, a keyed operational transconductance amplifier (OTA) 53, a filter capacitor 54, a buffer stage 55, and an electronic switch 70. Buffer 55 comprises a level shifting circuit with a high input impedance and a relatively low output impedance, and exhibits an AC gain of approximately unity. The sampling function is performed during a sampling interval, following the clamping interval during each AKB interval, by means of a network comprising amplifier 52, a keyed operational transconductance amplifier (OTA) 57, and an average responding charge storage capacitor 58. A kinescope bias correction voltage is developed across capacitor 58 and is coupled via a low output impedance buffer amplifier 50 and a resistor network 60, 62, 64 to the kinescope driver via a bias control input at the base of transistor 20. The correction voltage developed across capacitor 58 serves to automatically maintain a desired correct level of kinescope black current conduction. The bias correction voltage developed across storage capacitor 58 is a function of both voltage change $V_1$ developed at node B during the clamping interval, and a voltage change $V_2$ developed at node B during the subsequent sampling interval, as will be discussed in greater detail subsequently in connection with the waveforms shown in FIG. 2.

During the clamping set-up reference interval, both OTA 53 and switch 70 are rendered conductive in response to clamping control signal $V_C$. At this time OTA 57 is non-conductive so that the charge on storage capacitor 58 remains unaffected during the clamping interval. As a consequence of the feedback action during the clamping interval, the inverting (−) input of voltage amplifier 52, to which input capacitor 51 is coupled is reference to (i.e., clamped to) a voltage which is a function of a fixed reference voltage $V_{REF}$ applied to the non-inverting input (+) of amplifier 52. The feedback action provided during the clamping interval causes the inputs of amplifier 52 to exhibit a balanced condition prior to the end of the clamping interval, whereby the voltage at the inverting input of amplifier 52 is caused to be substantially equal to reference voltage $V_{REF}$ at the non-inverting input of amplifier 52. Thus the differential input voltage of amplifier 52 is substantially zero, whereby amplifier 52 is biased for balanced, linear operation. This condition corresponds to the reference condition for the following sampling function. At this time voltage $V_3$ across input capacitor 51 is a function of the level of voltage change $V_1$ developed at node B, and the input reference voltage of amplifier 52 provided via the feedback clamping action.

During the following sampling interval when voltage change $V_2$ is developed at node B, OTA 53 and switch 70 are rendered non-conductive, and OTA 57 is rendered conductive in response to sampling control signal $V_S$. The magnitude of voltage change $V_2$ is indicative of the magnitude of the kinescope black current level, and is sampled by means of amplifier 52 and OTA 57 to develop a corresponding voltage across storage capacitor 58.

In this system voltage $V_3$ across input capacitor 51, and the voltage applied to the inverting input of amplifier 52, will not change if voltage changes $V_1$ and $V_2$ are representative of a correct kinescope black current level. In such case the balanced input bias of amplifier 52 as established during the clamping interval remains unchanged during the sampling interval, whereby the control voltage across storage capacitor 58 remains unchanged.

When the kinescope black current level is too high or too low, the voltages supplied to input capacitor 51 will unbalance the inputs of amplifier 52 and will cause storage capacitor 58 to be charged or discharged via OTA 57 during the sampling process, so as to maintain a correct kinescope bias corresponding to the desired black current level.

Capacitor 54 stabilizes the clamping feedback loop of network 50 against oscillation, and also retains a residual voltage from the previous clamping interval. The latter feature permits the balanced input condition of amplifier 52 to be established more quickly by feedback action, by reducing the time required to modify the charge on input capacitor 51 via switch 70.

Feedback switch 70, when non-conductive (open) during the sampling interval, assures that the amount by which capacitor 54 can discharge during the sampling interval is very small. When non-conductive, switch 70 also decouples the feedback path to prevent interaction with the sampling signal processing function.

The structure and function of feedback switch 70 will now be described in greater detail.

Switch 70, which can be constructed as an integrated circuit, comprises an output emitter follower transistor 71 and an associated current source transistor 72. Transistors 71 and 72 are similar, and in particular are matched with respect to current gain and distributed base input capacitance.

Switch 70 also includes keyed switching control transistors 73 and 74. These transistors are mutually similar (i.e., matched). In this example matched transistors 73 and 74 are constructed in the form of an integrated circuit with a common substrate, equal areas, and substantially the same geometry and dimensions. In particular, these transistors exhibit substantially equal current gain and distributed base input capacitance. The other circuit elements of switch 70 are also formed in the same integrated circuit. The output loads of transistors 73 and 74 are respectively determined primarily by equal value resistors 75 and 76. The voltages respectively developed across these resistors are applied to the base inputs of output transistors 71 and 72, which are also mutually matched in the manner mentioned above.

An emitter diode 77 protects the emitter-base junction of transistor 71 from reverse breakdown when the base voltage of transistor 71 is sharply reduced as will be discussed subsequently. An emitter resistor 78 serves to establish the current conduction level of transistor 72, and develops a voltage drop which is substantially equal to the voltage drop across diode 77 (approximately +0.7 volts). Transistor 71 serves to charge capacitor 51 as required during the clamping interval when transistor 71 conducts, and is capable of sourcing a current of approximately 10 milliamperes. Transistor 72 also conducts during the clamping interval, and discharges capacitor 51 as required during the clamping interval. Transistor 72 conducts a current of approximately 2 milliamperes.

The conductive states of mutually similar transistors 71, 72 are controlled in response to the conductive states of mutually similar transistors 73, 74. The latter transistors are keyed into and out of conduction in response to clamping control signal $V_C$ applied to the base of transistor 80. Transistor 80 conducts an inverted version of signal $V_C$ to a resistor 82, the voltage across which controls the conductive states of transistors 73, 74 in common. A current determining resistor 81 is included in the emitter circuit of transistor 80.

The clamping process begins when control signal $V_C$ goes positive, thereby rendering transistors 80, 73 and 74 non-conductive, whereby transistors 71 and 72 are biased to conduct in response to base bias derived from the voltages across resistors 75 and 76, respectively. At the end of the clamping interval, the feedback clamping loop is stabilized such that a reference voltage is developed at the negative terminal of input clamping capacitor 51. At this time capacitor 51 is being neither charged nor discharged by transistors 71, 72, whereby the emitter current of transistor 71 is substantially equal to the collector current of transistor 72. Transistors 71 and 72 conduct substantially equal base currents at this time. At this time transistor 71 exhibits a base voltage of approximately +7.4 volts, and transistor 72 exhibits base voltage of approximately +1.4 volts.

It is noted that at the end of the clamping interval, when switch 70 is rendered non-conductive, control voltage $V_C$ drops sharply to a less positive level sufficient to render transistor 80 conductive. This causes a rapidly increasing positive voltage to be developed across resistor 82, sufficient to cause transistors 73 and 74 to simultaneously conduct heavily in a saturated state and to exhibit collector potentials which closely approximate ground potential. The conductive state of transistors 73 and 74 renders transistors 71 and 72, and thereby switch 70, non-conductive. Buffer 55 is preferably rendered non-conductive coincident with transistors 73 and 74 being rendered conductive.

More specifically, at the end of the clamping interval matched transistors 73, 74 conduct substantially equal base currents in response to the voltage developed across resistor 82, and develop corresponding substantially equal increasing collector currents. These equal collector currents, in conjunction with the equal values of resistors 75 and 76, cause the voltages developed across resistors 75, 76 to decrease at the same rate. Accordingly, the base bias voltages of matched transistors 71 and 72 decrease at the same rate. Transistors 71 and 72 are cut-off when their respective base bias voltages decrease by approximately 1 volt from the pre-existing base bias voltages (+7.4 volts and +1.4 volts, respectively). The similar base input diffusion capacitances of transistors 71, 72 assist to assure that their base bias voltages decrease at the same rate.

The equal collector currents conducted by transistors 73, 74 and the equal rates of voltage change across resistors 75, 76 at the end of the clamping interval result from the matched current gain characteristic of transistors 73, 74, and from the equal values selected for resistors 75 and 76. The equal rates of change of the collector currents of transistors 73, 74 are attributable to the matched base input diffusion capacitances of transistor 73, 74. Thus with the disclosed switching arrangement transistors 71 and 72 are rendered non-conductive substantially simultaneously, such that the transient current conduction of transistor 71 at the end of the clamping interval is offset equally by the transient current conduction of transistor 72 at this time.

If transistor 71 was permitted to turn-off before transistor 72, a large negative-going current transient would appear at the collector of transistor 72 and capacitor 51. If transistor 72 was permitted to turn-off before transistor 71, a large positive-going voltage transient and a corresponding positive transient current would appear at the collector of transistor 72. Such transient currents can exhibit a magnitude of approximately 5 milliamperes and a duration of up to one microsecond. Transients of this nature would distort the clamping reference voltage required for accurate information sampling during the succeeding sampling interval, and would impair the operation of the AKB bias control function, particularly because changes in the amplitude of the signal being sampled are very small (on the order of a few millivolts).

Following is a more detailed discussion of the clamping and sampling operation of network 50, made with reference to the waveforms of FIG. 2.

Auxiliary signal $V_P$ is applied to circuit node B in FIG. 1 via a diode 35 and a voltage translating impedance network comprising resistors 32 and 34, e.g., with values of 220 kilohms and 270 kilohms, respectively. Signal $V_P$ exhibits a positive DC level of approximately +8.0 volts at all times except during the AKB sampling interval, for maintaining diode 35 conductive so that a normal DC bias voltage is developed at node B. When the positive DC component of signal $V_P$ is present, the junction of resistors 32 and 34 is clamped to a voltage equal to the positive DC component of signal $V_P$, minus the voltage drop across diode 35. Signal $V_P$ manifests a negative-going, less positive fixed amplitude pulse component during the AKB sampling interval. Diode 35 is rendered non-conductive in response to negative pulse $V_P$, whereby the junction of resistors 32 and 34 is unclamped. Resistor 31 causes insignificant attenuation of the voltage change developed at node A relative to the corresponding voltage change ($V_1$) developed at node B since the value of resistor 31 (on the order of 200 ohms) is small relative to the values of resistors 32 and 34.

Prior to the clamping interval but during the AKB interval, the pre-existing nominal DC voltage ($V_{DC}$) appearing at node B charges the positive terminal of capacitor 51. During the clamping interval when grid drive pulse $V_G$ is developed, the voltage at node A decreases in response to pulse $V_G$ by an amount representative of the black current level. This causes the voltage at node B to decrease to a level substantially equal to $V_{DC}-V_1$. Also during the clamping interval, timing signal $V_C$ causes clamping switch 70 to close (i.e., conduct) whereby the inverting (−) signal input of amplifier 52 receives a reference voltage ($V_R$) via feedback clamping action for producing the balanced input bias condition discussed previously. During the clamping interval, voltage $V_3$ across capacitor 51 is a function of the clamping reference voltage ($V_R$) at the negative terminal of capacitor 51, and a voltage at the positive terminal of capacitor 51 corresponding to the difference between the described pre-existing nominal DC level ($V_{DC}$) at node B and voltage change $V_1$ developed at node B during the clamping interval. Thus voltage $V_3$ across capacitor 51 during the clamping reference interval is a function of the level of black current representative voltage change $V_1$, which may vary. Voltage $V_3$ can be expressed as $(V_{DC}-V_1)-V_R$.

During the immediately following sampling interval, positive grid drive pulse $V_G$ is absent, causing the voltage at node B to increase positively to the pre-existing nominal DC level $V_{DC}$ that appeared prior to the clamping interval. Simultaneously, negative pulse $V_P$ appears, reverse biasing diode 35 and perturbing (i.e., momentarily changing) the normal voltage translating and coupling action of resistors 32, 34 such that the voltage at node B is reduced by an amount $V_2$ as indicated in FIG. 2. At the same time, clamping switch 70 and OTA 53 are rendered non-conductive and OTA 57 conducts in response to signal $V_S$.

Thus during the sampling interval the input voltage applied to the inverting signal input (−) of amplifier 52 is equal to the difference between the voltage at node B and voltage $V_3$ across input capacitor 51. The input voltage applied to amplifier 52 is a function of the magnitude of voltage change $V_1$, which can vary with changes in the kinescope black current level.

The voltage on output storage capacitor 58 remains unchanged during the sampling interval when the magnitude of voltage change $V_1$ developed during the clamping interval equals the magnitude of voltage change $V_2$ developed during the sampling interval, indicating a correct kinescope black current level. This results because during the sampling interval, voltage change $V_1$ at node B increases in a positive direction (from the clamping set-up reference level) when the grid drive pulse is removed, and voltage change $V_2$ causes a simultaneous negative-going voltage perturbation at node B. When kinescope bias is correct, positive-going voltage change $V_1$ and negative-going voltage change $V_2$ exhibit equal magnitudes whereby these voltage changes mutually cancel during the sampling interval, leaving the voltage at node B unchanged.

When the magnitude of voltage change $V_1$ is less than the magnitude of voltage change $V_2$, amplifier 57 proportionally charges storage capacitor 58 in a direction for increasing cathode black current conduction. Conversely, amplifier 57 proportionally discharges storage capacitor 58 for causing decreased cathode black current conduction when the magnitude of voltage change $V_1$ is greater than the magnitude of voltage change $V_2$.

As more specifically shown by the waveforms of FIG. 2, the amplitude "A" of voltage change $V_1$ is assumed to be approximately three millivolts when the cathode black current level is correct, and varies over a range of a few millivolts ($\pm\Delta$) as the cathode black current level increases and decreases relative to the correct level as the operating characteristics of the kinescope change. Thus the clamping interval set-up reference voltage across capacitor $V_3$ varies with changes in the magnitude of voltage $V_1$ as the cathode black current level changes. Voltage change $V_2$ at node B exhibits an amplitude "A" of approximately three millivolts, which corresponds to amplitude "A" associated with voltage change $V_1$, when the black current level is correct.

As indicated by waveform $V_{COR}$ in FIG. 2 corresponding to a condition of correct kinescope bias, the voltage at the inverting input of amplifier 52 remains unchanged during the sampling interval when voltages $V_1$ and $V_2$ are both of amplitude "A". However, as indicated by waveform $V_H$, the input voltage of amplifier 52 increases by an amount $\Delta$ when voltage change $V_1$ exhibits amplitude "A+$\Delta$", corresponding to a high black current level. In this event amplifier 57 discharges output storage capacitor 58, so that the bias control voltage applied to the base of transistor 20 causes the collector voltage of transistor 22 to increase, whereby the cathode black current decreases toward the correct level.

Conversely, and as indicated by waveform $V_L$, the input voltage of amplifier 52 decreases by an amount $\Delta$ during the sampling interval when voltage change $V_1$ exhibits amplitude "A−Δ", corresponding to a low black current level. In this case amplifier 57 charges output storage capacitor 58, causing the collector voltage of transistor 22 to decrease whereby the cathode black current increases toward the correct level. In either case, several sampling intervals may be required to achieve the correct black current level.

The described combined-pulse sampling technique is discussed in greater detail in a copending U.S. patent application Ser. No. 434,314 of R. P. Parker titled "Signal Processing Network For An Automatic Kinescope Bias Control System," incorporated herein by reference. This copending application also discloses additional information concerning the arrangement including auxiliary control signal $V_P$, as well as disclosing a suitable arrangement for timing signal generator 40.

What is claimed is:

1. A signal sampling system operative during a reference interval and a subsequent sampling interval, comprising:

a source of input signals containing information to be sampled;

sampling means operative during said sampling interval and responsive to said input signals for providing an output signal representative of said information;

a source of switching signals; and referencing means, including a capacitance, coupled to said input signal source and said sampling means and operative during said reference interval to develop a reference bias on said capacitance for establishing a sampling reference bias condition for said sampling means, wherein said referencing means comprises:

first current conducting means responsive to said switching signals and coupled to said capacitance for providing currents for charging said capacitance;

second current conducting means responsive to said switching signals and coupled to said capacitance for providing currents for discharging said capacitance; and means for rendering said first and second current conducting means non-conductive substantially simultaneously at the end of said reference interval, to suppress switching transients associated with the operation of said first and second current conducting means in response to said switching signals at the end of said reference interval.

2. A system according to claim 1, wherein said first and second current conducting means conduct currents of substantially equal magnitude at the end of said reference interval.

3. In a video signal processing system including an image display device, apparatus for automatically controlling the level of black image current conducted by said image display device, said apparatus being operative during sequential reference and sampling intervals and comprising:

means for deriving a signal representative of the magnitude of said black current;

sampling means operative during said sampling interval and responsive to said derived signal for providing to said image display device a control signal for maintaining a desired black current level;

a source of switching signals; and referencing means, including a capacitance, coupled to said deriving means and said sampling means and operative during said reference interval to develop a reference bias on said capacitance for establishing a sampling reference bias condition for said sampling means, wherein said referencing means comprises:

first current conducting means responsive to said switching signals and coupled to said capacitance for providing currents for charging said capacitance;

second current conducting means responsive to said switching signals and coupled to said capacitance for providing currents for discharging said capacitance; and means for rendering said first and second current conducting means non-conductive substantially simultaneously at the end of said reference interval, to suppress switching transients associated with the operation of said first and second current conducting means in response to said switching signals at the end of said reference interval.

4. Apparatus according to claim 3, wherein said first and second current conducting means conduct currents of substantially equal magnitude at the end of said reference interval.

5. Apparatus according to claim 3, wherein said switching transients otherwise exhibit a magnitude which is significant relative to the magnitude of said derive representative signal being sampled.

6. Apparatus according to claim 3, wherein said sampling means comprises an input amplifier; and said reference bias is applied to a signal input of said input amplifier for establishing said reference bias condition.

7. Apparatus according to claim 6, wherein said capacitance comprises an input AC coupling capacitor with a first terminal coupled to said signal deriving means and a second terminal coupled to said signal input of said input amplifier; and said reference bias is developed at said second terminal of said capacitor.

8. Apparatus according to claim 7, wherein said input amplifier and said referencing means including said capacitor are arranged as a feedback clamp during said reference interval.

9. A switching circuit for selectively providing current to a utilization circuit, comprising:

first and second active current conducting control devices each with an input, and an output;

first and second impedances respectively coupled to said outputs of said first and second control devices and representing the primary output load impedances for said control devices, said impedances developing respective bias voltages thereacross in accordance with output currents of said control devices;

first and second active current conducting output devices each with an input, and outputs coupled in common to said utilization circuit, said first and second output devices exhibiting conductive states in response to said respective bias voltages; and means for causing said control devices to exhibit a first conductive state for rendering said output devices conductive, and for causing said control devices to exhibit a second conductive state for rendering said output devices non-conductive; wherein said first and second control devices are mutually matched for exhibiting substantially similar operating characteristics;

said first and second output devices are mutually matched for exhibiting substantially similar operating characteristics; and said first and second impedances are of substantially equal value such that said respective bias voltages exhibit substantially equal rates of change in response to output currents of said control devices during transitions from said first conductive state to said second conductive state for rendering said output devices non-conductive substantially simultaneously.

10. A circuit according to claim 9, wherein said utilization circuit comprises a capacitance;

said first output device conducts current for charging said capacitance;

said second output device conducts current for discharging said capacitance;

said output devices are rendered non-conductive in response to said control devices being rendered conductive; and said output devices conduct currents of substantially equal magnitude immediately prior to being rendered non-conductive.

11. Switching apparatus comprising:

a capacitance;

a first transistor with a base input electrode, a collector electrode, and an emitter output electrode coupled to said capacitance for providing first output currents for modifying the charge on said capacitance;

a second transistor with a base input electrode, an emitter electrode, and a collector output electrode coupled to said capacitance for providing second output currents for modifying the charge on said capacitance;

a first resistor coupled to a bias potential and to said first transistor for determining an operating bias voltage for said first transistor;

a second resistor coupled to a bias potential and to said second transistor for determining an operating bias voltage for said second transistor;

third and fourth transistors with output main current conduction paths respectively coupled to said first and second resistors for causing said first and second resistors to develop bias voltages thereacross in response to the conductive state of said third and fourth transistors; and means for causing said third and fourth transistors to exhibit first and second conductive states for respectively rendering said first and second transistors conductive and non-conductive, respectively; wherein said first and second transistors are mutually matched for exhibiting substantially similar operating characteristics;

said third and fourth transistors are mutually matched for exhibiting substantially similar operating characteristics;

said first and second resistors respectively represent the primary load impedances for said third and fourth transistors and exhibit substantially equal values such that said bias voltages for said first and second transistors exhibit substantially equal rates of change in response to output currents of said third and fourth transistors during transitions from one conductive state to another for rendering said output devices non-conductive substantially simultaneously.

12. Apparatus according to claim 11, wherein said first and second transistors are rendered conductive when said third and fourth transistors are rendered non-conductive;

said first and second transistors are rendered non-conductive substantially simultaneously when said third and fourth transistors are rendered conductive;

said first transistor comprises an emitter follower for conducting said first currents to said capacitance; and said second transistor comprises a current course for said emitter follower, for conducting said second currents from said capacitance.

13. A signal processing system comprising:

a source of signals containing information to be sampled;

a source of reference voltage;

a sampling amplifier having an input and an output, for processing said signal information;

a clamping network, including a first capacitance, coupled to said sampling amplifier for establishing a sampling reference condition for signals processed by said sampling amplifier; and switching means operative during a reference interval preceding signal sampling intervals for coupling a voltage related to said reference voltage to said first capacitance via a clamping signal path to establish a reference bias condition for said first capacitance, and for decoupling said clamping signal path during said sampling interval; said switching means being arranged to suppress switching transients at the end of said reference interval, and comprising first and second active current conducting control devices each with an input and an output;

first and second impedances respectively coupled to said outputs of said first and second control devices and representing the primary output load impedances for said control devices, said impedances developing respective bias voltages thereacross in accordance with output currents of said control devices;

first and second active current conducting output devices each with an input, and outputs coupled in common to said first capacitance, said first and second output devices exhibiting conductive states in response to said respective bias voltages;

means for coupling said reference voltage to one of said output devices during said reference interval; and means for causing said control devices to exhibit a first conductive state for rendering said output devices conductive during said reference interval, and for causing said control devices to exhibit a second conductive state for rendering said output devices non-conductive during said sampling interval; wherein said first and second control devices are mutually matched for exhibiting substantially similar operating characteristics;

said first and second output devices are mutually matched for exhibiting substantially similar operating characteristics; and said first and second impedances are of substantially equal value such that said respective bias voltages exhibit substantially equal rates of change in response to output currents of said control devices during transitions from one conductive state to another for rendering said output devices non-conductive substantially simultaneously at the end of said reference interval.

14. A system according to claim 13, wherein said output devices conduct output currents of mutually opposite senses for charging and discharging said first capacitance;

said output devices are rendered non-conductive in response to said control devices being rendered conductive; and said output devices conduct currents of substantially equal magnitude at the end of said reference interval.

15. A system according to claim 13, wherein said first capacitance comprises an input capacitance for AC coupling said information signals to said sampling amplifier; and a second capacitance is coupled to said output of said sampling amplifier for developing a voltage thereacross representative of said signal information.

16. A system according to claim 13, wherein said information to be sampled comprises a signal amplitude component; and said switching transisents otherwise exhibit a magnitude which is significant relative to said sampled signal amplitude.

17. In combination with a system for automatically controlling the black image current conducted by an image display device associated with a video signal processing system, said system including means for deriving a signal representative of the magnitude of said black image current; apparatus for processing said derived signal during a control interval encompassing a reference interval and a subsequent sampling interval, comprising:

a source of reference voltage;

a sampling amplifier having an input for receiving said derived signal, and an output;

a clamping network, including a capacitance, coupled to said sampling amplifier for establishing a sampling reference condition for signals processed by said amplifier; and switching means operative during said reference interval for coupling a voltage related to said reference voltage to said capacitance via a clamping signal path to establish a reference bias condition for said capacitance, and for decoupling said clamping signal path during said sampling interval; said switching means being arranged to suppress switching transients at the end of said reference interval, and comprising first and second active current conducting control devices each with an input and an output;

first and second impedances respectively coupled to said outputs of said first and second control devices and representing the primary output load impedances for said control devices, said impedances developing respective bias voltages thereacross in accordance with output currents of said control devices;

first and second active current conducting output devices each with an input, and outputs coupled in common to said capacitance, said first and second output devices exhibiting conductive states in response to said respective bias voltages;

means for coupling a voltage related to said reference voltage to one of said output devices during said reference interval; and means for causing said control devices to exhibit a first conductive state for rendering said output devices conductive during said reference interval, and for causing said control devices to exhibit a second conductive state for rendering said output devices non-conductive during said sampling interval; wherein said first and second control devices are mutually matched for exhibiting substantially similar operating characteristics;

said first and second output devices are mutually matched for exhibiting substantially similar operating characteristics; and said first and second impedances are of substantially equal value such that said respective bias voltages exhibit substantially equal rates of change in response to output currents of said control devices during transitions from one conductive state to another for rendering said output devices non-conductive substantially simultaneously at the end of said reference interval.

18. Apparatus according to claim 17, wherein said output devices conduct currents of mutually opposite senses for charging and discharging said capacitance as required during said reference interval; and said output devices conduct currents of substantially equal magnitude at the end of said reference interval.

19. Apparatus according to claim 17, wherein said first capacitance comprises an input capacitor for AC coupling said derived signal to said amplifier; and a second capacitance is coupled to said output of said sampling amplifier for developing a voltage thereacross representative of the magnitude of said black current.

* * * * *